United States Patent
Song

(10) Patent No.: US 9,190,138 B2
(45) Date of Patent: Nov. 17, 2015

(54) SEMICONDUCTOR MEMORY DEVICE

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/293,694

(22) Filed: Jun. 2, 2014

(65) Prior Publication Data

US 2015/0155030 A1    Jun. 4, 2015

(30) Foreign Application Priority Data

Dec. 4, 2013   (KR) .................. 10-2013-0149769

(51) Int. Cl.
   *G11C 5/02*     (2006.01)
   *G11C 11/406*   (2006.01)
   *G11C 11/408*   (2006.01)
   *G11C 7/02*     (2006.01)

(52) U.S. Cl.
   CPC .......... *G11C 11/40618* (2013.01); *G11C 5/025* (2013.01); *G11C 7/02* (2013.01); *G11C 11/406* (2013.01); *G11C 11/408* (2013.01); *G11C 11/4087* (2013.01); *G11C 11/40611* (2013.01)

(58) Field of Classification Search
   CPC .......... G11C 11/406; G11C 11/40611; G11C 11/40618; G11C 11/408; G11C 11/4087; G11C 5/025

USPC ............................... 365/222, 51, 63
   See application file for complete search history.

(56) References Cited

U.S. PATENT DOCUMENTS

| 7,864,618 | B2 * | 1/2011 | Riho et al. | ............ | 365/230.03 |
| 2002/0154557 | A1 * | 10/2002 | Mizugaki et al. | ............ | 365/200 |
| 2007/0250677 | A1 * | 10/2007 | Ware et al. | ............ | 711/167 |
| 2011/0026290 | A1 * | 2/2011 | Noda et al. | ............ | 365/51 |
| 2011/0205828 | A1 * | 8/2011 | Richter et al. | ............ | 365/230.03 |
| 2012/0134217 | A1 * | 5/2012 | Fujisawa et al. | ............ | 365/189.05 |
| 2014/0219043 | A1 * | 8/2014 | Jones et al. | ............ | 365/230.06 |

FOREIGN PATENT DOCUMENTS

KR   1020090079789   7/2009

* cited by examiner

*Primary Examiner* — Ly D Pham
(74) *Attorney, Agent, or Firm* — IP & T Group LLP

(57) ABSTRACT

A semiconductor memory device includes a first bank, a second bank disposed separately from the first bank along a first direction, a third bank disposed separately from the first bank along a second direction substantially perpendicular to the first direction, a fourth bank disposed separately from the second bank along the second direction and from the third bank along the first direction, a first row control region, which is disposed between the first bank and the second bank, suitable for controlling a row decoding operation of the first bank and the second bank, a second row control region, which is disposed between the third bank and the fourth bank, suitable for controlling a row decoding operation of the third bank and the fourth bank, and a refresh control unit suitable for controlling a refresh operation of the first to fourth banks.

11 Claims, 5 Drawing Sheets

SEMICONDUCTOR MEMORY DEVICE

CROSS-REFERENCE TO RELATED APPLICATIONS

The present application claims priority to Korean Patent Application No, 10-2013-0149769, filed on Dec. 4, 2013, which is incorporated herein by reference in its entirety.

BACKGROUND

1. Field

Exemplary embodiments of the present invention relate to a semiconductor design technology, and more particularly, to a semiconductor memory device for reducing an area of a refresh logic circuit that prevents the data deterioration of a memory cell caused by the disturbance of word lines.

2. Description of the Related Art

In general, a semiconductor memory device such as a double data rate synchronous dynamic random access memory (DDR SDRAM) includes tens of millions of memory cells, and stores and outputs data in response to a command requested from a chipset. That is, if the chipset requests a write operation to the semiconductor memory device, the semiconductor memory device stores data on a memory cell corresponding to an address inputted from the chipset, and if the chipset requests a read operation to the semiconductor memory cell, the semiconductor memory device outputs the data stored on the memory, cell corresponding to the address inputted from the chipset.

A group of memory cells is referred to as a memory bank. The number of memory banks may be changed according to a design of the semiconductor memory device.

FIG. 1 is a block diagram illustrating a conventional semiconductor memory device.

Referring to FIG. 1, a conventional semiconductor memory device 1000 includes a plurality of bank groups. Each 100 of the plurality of bank groups includes four memory banks 110A, 110B, 110C and 110D, two row control regions 120 and 130, four column control regions 140A, 1406, 140C and 140D, and two refresh control units 150 and 160. Each of the four memory banks 110A, 110B, 110C and 110D includes a plurality of memory cells. The two row control regions 120 and 130 and four column control regions 140A, 140B, 140C and 140D correspond to the four memory banks 110A, 110B, 110C and 110D. For reference, the two row control regions 120 and 130 include circuits for controlling a row access of the four memory banks 110A, 110B, 110C and 110D. The four column control regions 140A, 140B, 140C and 140D include circuits for controlling a column access of the four memory banks 110A, 1106, 1100 and 110D. The four memory banks 110A, 110B, 110C and 110D are disposed along a first direction in the conventional semiconductor memory device 1000.

As the integration of memory cells are increased, an interval among a plurality of word lines included in the conventional semiconductor memory device is reduced. As the interval among the word lines is reduced, a coupling effect among adjacent word lines is increased. As the coupling effect among the adjacent word lines is increased, data of memory cells coupled to the word lines, which are frequently activated, are damaged. This is referred to as a word line disturbance. Due to word line disturbance, data of memory cells are damaged before the memory cells are refreshed. Thus, a target row refresh (TRR) operation is performed to prevent the word line disturbance. The TRR operation represents that when a target word line having large or frequent number of active-precharges is detected, the memory cells coupled to the adjacent word lines are refreshed. The refresh control units 150 and 150 activate the word lines corresponding to a target row address, which is applied in response to control signals CTRL_SIGs, e.g., an active command, during a target row refresh mode. Since the refresh control units 150 and 160 are disposed closely to the row control regions 140A, 140B, 140C and 140D, the refresh control units 150 and 160 perform an operation related to a row region of the memory banks 110A, 110B, 1100 and 110D. Moreover, since the four memory banks 110A, 110B, 110C and 110D are disposed along a first direction in each 100 of the bank groups of the conventional semiconductor memory device 1000, two refresh control units 150 and 160 are necessary. However, as the integration of a semiconductor memory device is increased, a plurality of refresh control units are disposed in each of the plurality of bank groups, and the area of the plurality of refresh control units are increased.

FIG. 2 is a diagram illustrating a target row refresh operation of the conventional semiconductor memory device.

In general, a semiconductor memory device includes a plurality of word lines. A semiconductor controller provides command signals CMDs, addresses ADDs and data to the semiconductor memory device, and controls the semiconductor memory device. If a word line having large or frequent number of active-precharges is frequently access, memory cells coupled to adjacent word lines are affected. That is, data of the memory cells may be damaged. Thus, the TRR operation may be performed to overcome above-mentioned problem.

Referring to FIG. 2, through the TRR operation, the deterioration of memory cells caused by the word line disturbance is prevented by detecting a word line having a frequent access and performing a refresh operation on the adjacent word lines. The semiconductor memory device or the semiconductor controller detects a target row address of the target word line having large or frequent number of active-precharges. If the target row address is detected, the semiconductor controller provides the command signals CMDs and the addresses ADDs for instructing a target active operation of the semiconductor memory device. If the semiconductor memory device is set to the TRR mode by a mode register set (MRS), after the active-precharge command for the TRR operation is applied three times the TRR mode exits. The target row address "N" is applied to the semiconductor memory device in response to a first active command signal ACT, and a precharge command signal is applied to the semiconductor memory device after a predetermined time elapses. The semiconductor memory device activates and precharges the target word line corresponding to the target row address "N". Subsequently, a second active command signal ACT is applied to the semiconductor memory device, a word line adjacent to the target word line is access in response to the second active command signal ACT, and a precharge operation is performed. Next, a third active command signal ACT is applied to the semiconductor memory device, another word line adjacent to the target word line is access in response to the third active command signal ACT, and the TRR operation is performed.

A refresh operation must be performed through an active-precharge operation of the word line corresponding to the target row address "N", and adjacent word lines thereto. Thus, a target row counter for receiving and counting the target row address "N", and generating addresses corresponding to the adjacent word lines is needed.

SUMMARY

Exemplary embodiments of the present invention are directed to a semiconductor memory device having an improved bank group structure for reducing an area of a refresh logic circuit that performs a refresh operation.

In accordance with an exemplary embodiment of the present invention, a semiconductor memory device may include a first bank, a second bank disposed separately from the first bank along a first direction, a third bank disposed separately from the first bank along a second direction substantially perpendicular to the first direction, a fourth bank disposed separately from the second bank along the second direction and from the third bank along the first direction, a first row control region, which is disposed between the first bank and the second bank, suitable for controlling a row decoding operation of the first bank and the second bank, a second row control region, which is disposed between the third bank and the fourth bank, suitable for controlling a row decoding operation of the third bank and the fourth bank, and a refresh control unit suitable for controlling a refresh operation of the first to fourth banks.

In accordance with an exemplary embodiment of the present invention, a semiconductor memory device including a plurality of bank groups, wherein each of the plurality of bank groups may include a first bank, a second bank disposed separately from the first bank along a first direction, a third bank disposed separately from the first bank along a second direction substantially perpendicular to the first direction a fourth bank disposed separately from the second bank along the second direction and from the third bank along the first direction, a first row control region, which is disposed between the first bank and the second bank, suitable for controlling a row decoding operation of the first bank and the second bank, a second row control region, which is disposed between the third bank and the fourth bank, suitable for controlling a row decoding operation of the third bank and the fourth bank, a peripheral circuit region disposed between the first row control region and the second row control region, and a refresh control unit, which is disposed in the peripheral circuit region, suitable for controlling a refresh operation of the first to fourth banks.

In accordance with an exemplary embodiment of the present invention, a semiconductor memory device may include a peripheral circuit region, and a plurality of bank group pairs, each bank group within a bank group pair being disposed opposite to each other relative to the peripheral circuit region, wherein each of the plurality bank groups includes a first bank, a second bank disposed separately from the first bank along a first direction, a third bank disposed separately from the first bank along a second direction substantially perpendicular to the first direction, a fourth bank disposed separately from the second bank along the second direction and from the third bank along the first direction, a first row control region, which is disposed between the first bank and the third bank, suitable for controlling a row decoding operation of the first bank and the third bank, a second row control region, which is disposed between the second bank and the fourth bank, suitable for controlling a row decoding operation of the second bank and the fourth bank, and a refresh control unit, which is disposed in the peripheral circuit region, suitable for controlling a refresh operation of the first to fourth banks.

DETAILED DESCRIPTION

Figure 1:
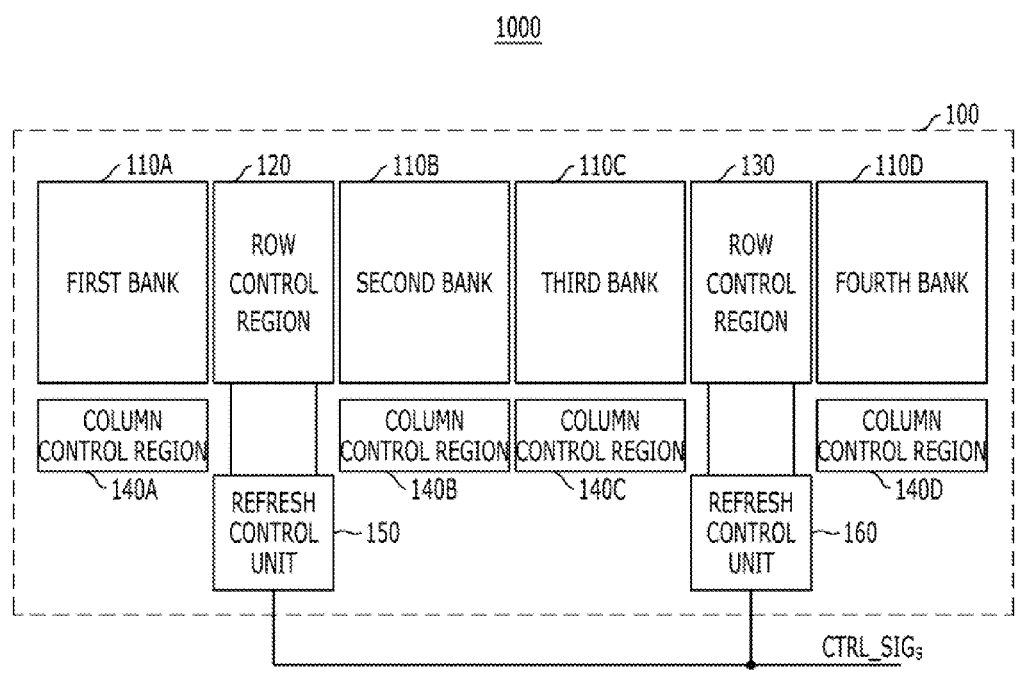
FIG. 1 is a block diagram illustrating a conventional semiconductor memory device.
Figure 2:
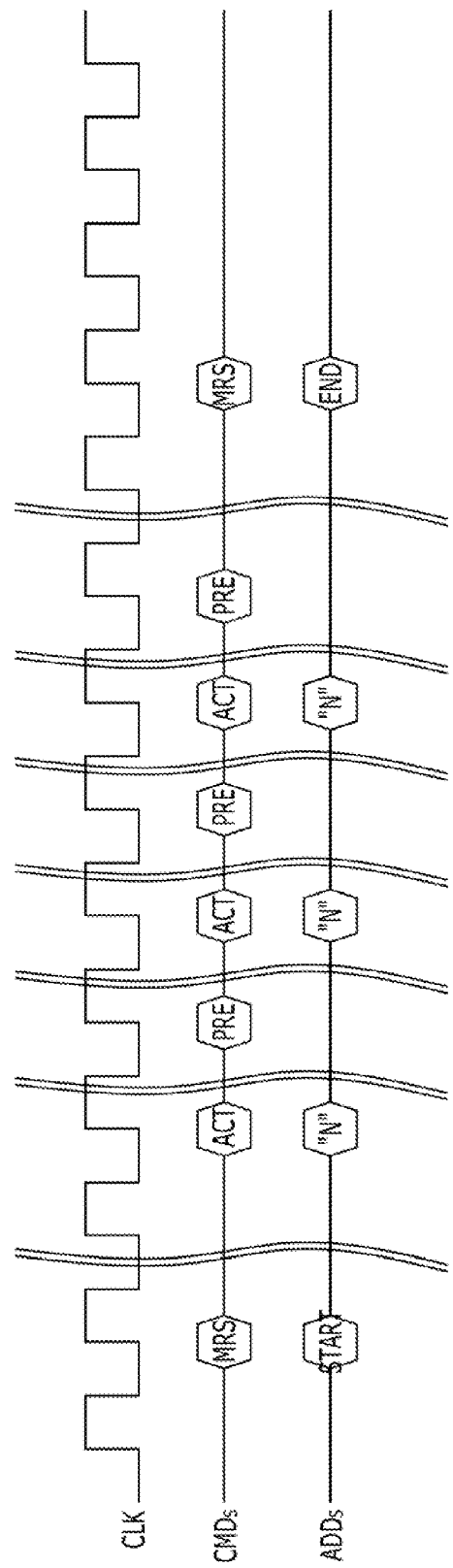
FIG. 2 is a diagram illustrating a target row refresh operation of the conventional semiconductor memory device.

Exemplary embodiments of the present invention will be described below in more detail with reference to the accompanying drawings. The present invention may however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Additionally, "include/comprise" or "including/comprising" used in the specification represents that one or more components, steps, operations, and elements exist or are added.

Figure 3:
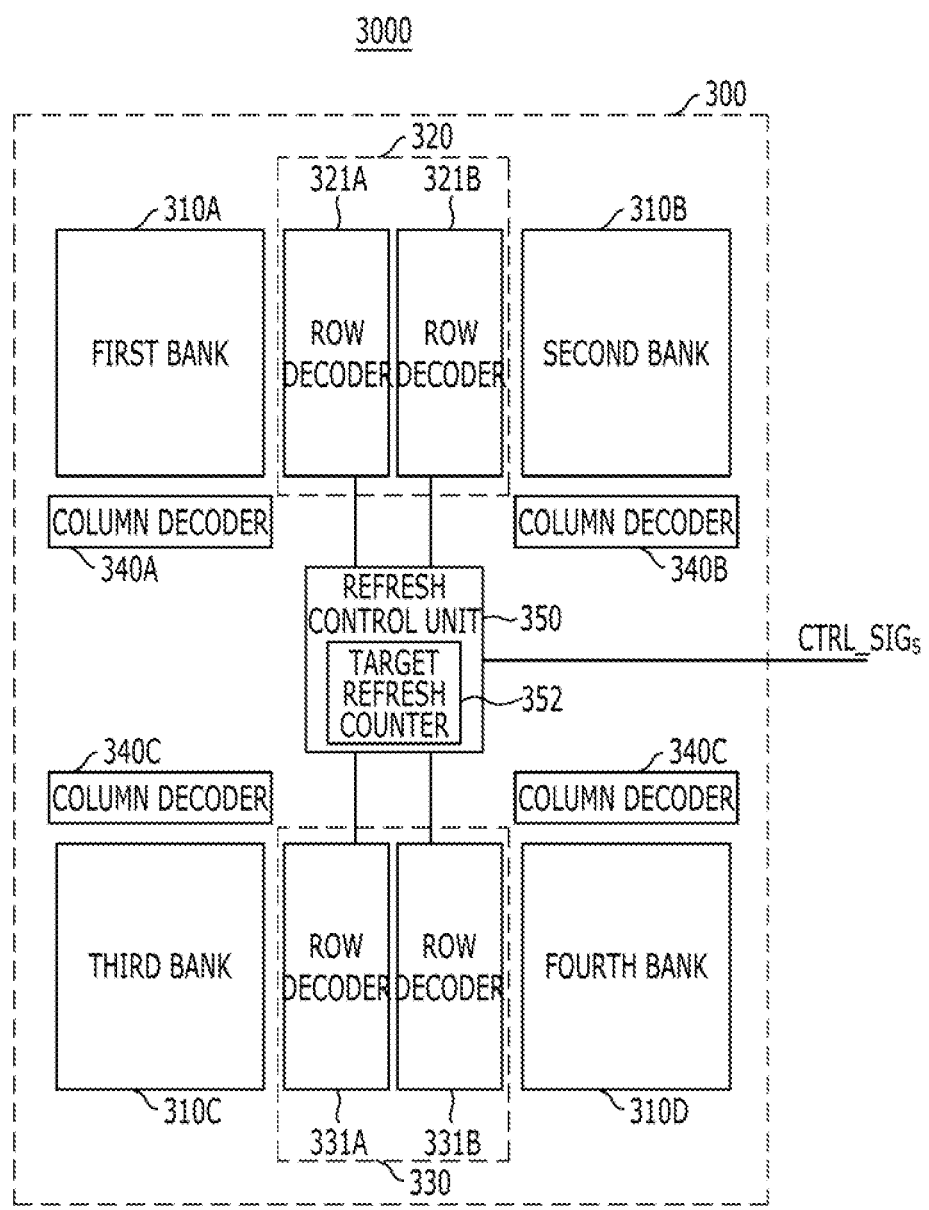
FIG. 3 is a block diagram illustrating a semiconductor memory device in accordance with a first embodiment of the present invention.

FIG. 3 is a block diagram illustrating a semiconductor memory device in accordance with a first embodiment of the present invention.

Referring to FIG. 3, a semiconductor memory device 3000 includes a bank group 300. The bank group 300 includes a first bank 310A, a second bank 310B, a third bank 310C, a fourth bank 310D, a first row control region 320, a second row control region 330, column decoders 340A, 340B, 340C and 340D and a refresh control unit 350.

The second bank 310B is disposed separately along a first direction of the first bank 310A. The third bank 310C is disposed separately along a second direction of the first bank 310A. The fourth bank 310D is disposed separately along the second direction of the second bank 310B and the first direction of the third bank 310C. The first row control region 320 is disposed between the first bank 310A and the second bank 310B, and controls a row address decoding operation of the first bank 310A and the second bank 310B. The first row control region 320 includes row decoders 321A and 321B for performing a row address decoding operation of the first bank 310A and the second bank 310B. The second row control region 330 is disposed between the third bank 310C and the fourth bank 310D and controls a row address decoding operation of the third bank 310C and the fourth bank 310D. The second row control region 330 includes row decoders 331A and 331B for performing a row address decoding operation of the third bank 310C and the fourth bank 310D.

The column decoders 340A and 340C are disposed along the first direction between the first bank 310A and the third bank 310C, and perform a column decoding operation of the first bank 310A and the third bank 310C. The column decoders 340B and 340D are disposed along the first direction between the second bank 310B and the fourth bank 310D, and perform a column decoding operation of the second bank 310B and the fourth bank 310D.

The refresh control unit 350 is disposed between the first row control region 320 and the second row control region 330, and controls the refresh operation of the first to fourth banks 310A, 310B, 310C and 310D. The refresh operation may represent a TRR operation. The refresh control unit 350 may include a circuit for performing the TRR operation, which sequentially active-precharges the word line corresponding to a target row address and adjacent word lines during a TRR mode. The refresh control unit 350 may include a target refresh counter 352 for receiving and counting the target row address and generating an address corresponding to the adjacent word line.

Moreover, the semiconductor memory device may further include a target row refresh main control unit (not shown). The refresh control unit 350 receives a plurality of control signals CTRL_SIGs from the target row refresh main control unit (not shown), and controls the TRR operation of the semiconductor memory device 3000.

In the bank group 300, the first row control region 320 disposed between the first bank 310A and the second bank 310B is opposite to the second row control region 330 disposed between the third bank 310C and the fourth bank 310D. Since the refresh control unit 350 performs an operation related to row regions of the first to fourth banks 310A, 310B, 310C and 310D, the refresh control unit 350 is disposed between the first row control region 320 and the second row control region 330. Compared with the conventional semiconductor memory device, only one refresh control unit is disposed in the bank group 300 of the semiconductor memory device in accordance with the first embodiment of the present invention. However, two refresh control units are disposed in the conventional semiconductor memory device. Thus, an area of a refresh operation circuit for performing the TRR operation may be reduced in the bank group of the semiconductor memory device in accordance with the first embodiment of the present invention.

Figure 4:
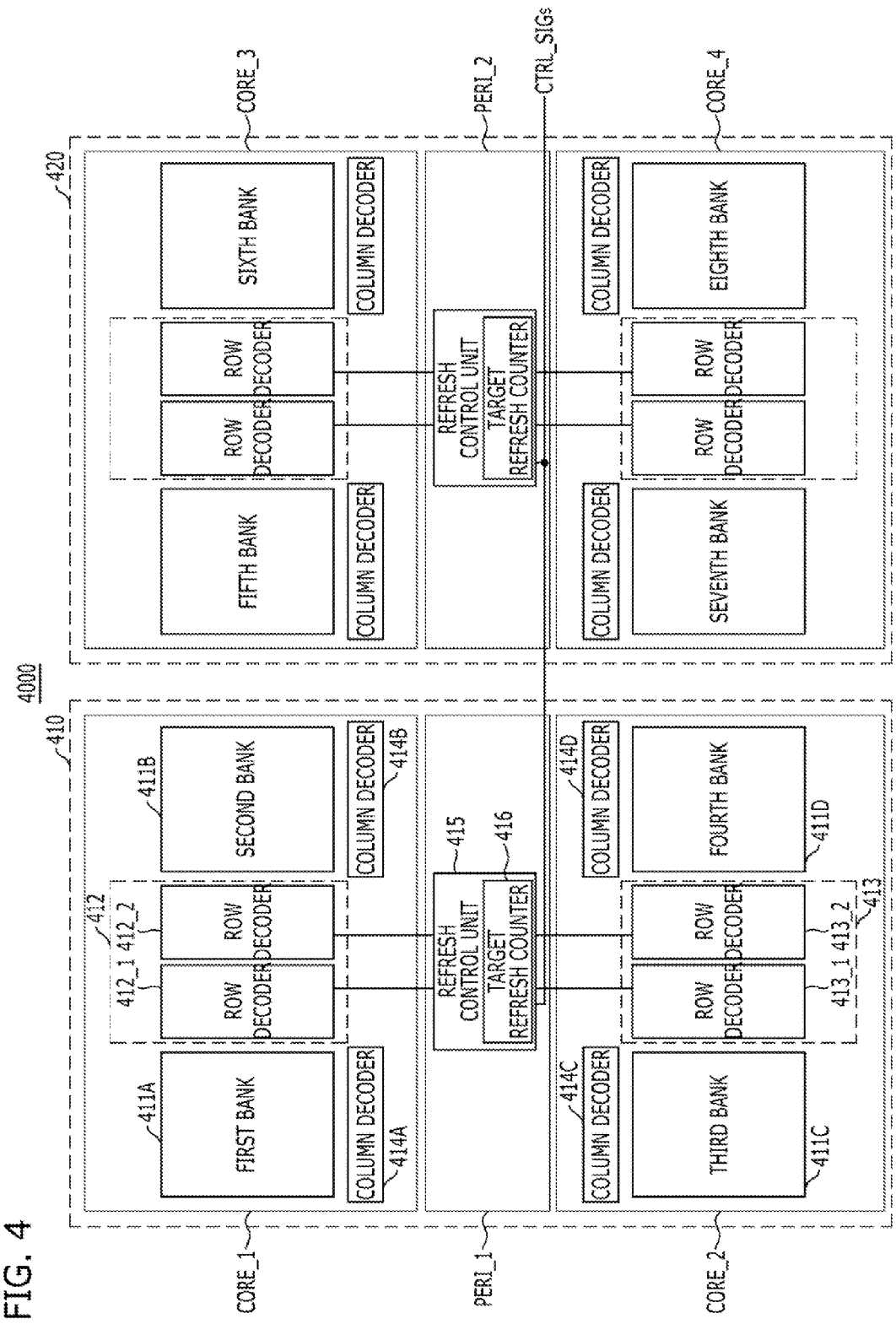
FIG. 4 is a block diagram illustrating a semiconductor memory device in accordance with a second embodiment of the present invention.

FIG. 4 is a block diagram illustrating a semiconductor memory device in accordance with a second embodiment of the present invention.

Referring to FIG. 4, a semiconductor memory device in accordance with a second embodiment of the present invention includes a first bank group 410 and a second bank group 420.

The first bank group 410 includes a first peripheral circuit region PERI_1, a first core region CORE_1 and a second core region CORE_2. The first core region CORE_1 is opposite to the second core region CORE_2. The first core region CORE_1 includes a first bank 411A, a second bank 411B, a first row control region 412 and column decoders 414A and 414B. The second bank 411B is disposed separately from the first bank 411A along a first direction. The first row control region 412 is disposed between the first bank 411A and the second bank 411B, and controls a row address decoding operation of the first bank 411A and the second bank 411B. The first row control region 412 includes a first row decoder 412_1 for controlling the row address decoding operation of the first bank 411A and a second row decoder 412_2 for controlling the row address decoding operation of the second bank 411B.

The second core region CORE_2 includes a third bank 411C, a fourth bank 411D, a second row control region 413 and column decoders 414C and 414D. The third bank 411C is disposed separately from the first bank 411A along a second direction. The fourth bank 411D is disposed separately from the second bank 411B along a second direction and from the third bank 411C along a first direction. The second row control region 413 is disposed between the third bank 411C and the fourth bank 411D, and controls a row address decoding operation of the third bank 411C and the fourth bank 411D.

The column decoders 414A to 414D corresponding to the first to fourth banks 411A to 411D are disposed adjacently to the first peripheral circuit region PERI_1, and perform a column decoding operation of the first to fourth banks 411A to 411D.

A first refresh control unit 415 is included in the first peripheral circuit region PERI_1 disposed between the first row control region 412 and the second row control region 413, and controls a refresh operation of the first to fourth banks 411A, 411B, 411C and 411D. The refresh operation may represent the TRR operation. Thus, the first refresh control unit 415 may include a circuit for performing the TRR operation, which sequentially active-precharges the word line corresponding to a target row address and adjacent word lines during a TRR mode. The first refresh control unit 415 may include a target refresh counter 416 for receiving and counting the target row address and generating an address corresponding to the adjacent word line.

Moreover, the semiconductor memory device 4000 may further include a target row refresh main control unit (not shown). The refresh control unit 415 receives a plurality of control signals CTRL_SIGs from the target row refresh main control unit (not shown), and controls the TRR operation of the semiconductor memory device 4000 in response to the plurality of control signals CTRL_SIGs.

In the first bank group 410, the first row control region 412 disposed between the first bank 411A and the second bank 411B is opposite to the second row control region 413 disposed between the third bank 411C and the fourth bank 411D. Since the refresh control unit 415 performs an operation related to row regions of the first to fourth banks 411A to 411D, refresh control unit 415 is disposed between the first row control region 412 and the second row control region 413. Compared with the conventional semiconductor memory device, only one refresh control unit 415 is disposed in the first bank group 410 of the semiconductor memory device in accordance with the first embodiment of the present invention. However two refresh control units are disposed in the conventional semiconductor memory device. Thus, an area of a refresh operation circuit for performing the TRR operation may be reduced in the first bank group of the semiconductor memory device in accordance with the second embodiment of the present invention.

The second bank group 420 includes a second peripheral circuit region PERI_2, a third core region CORE_3 and a fourth core region CORE_4. Since the configuration of the second bank group 420 is same as the configuration of the first bank group 410, for the convenience of the descriptions, the detailed descriptions of the second bank group 420 will be omitted.

Figure 5:
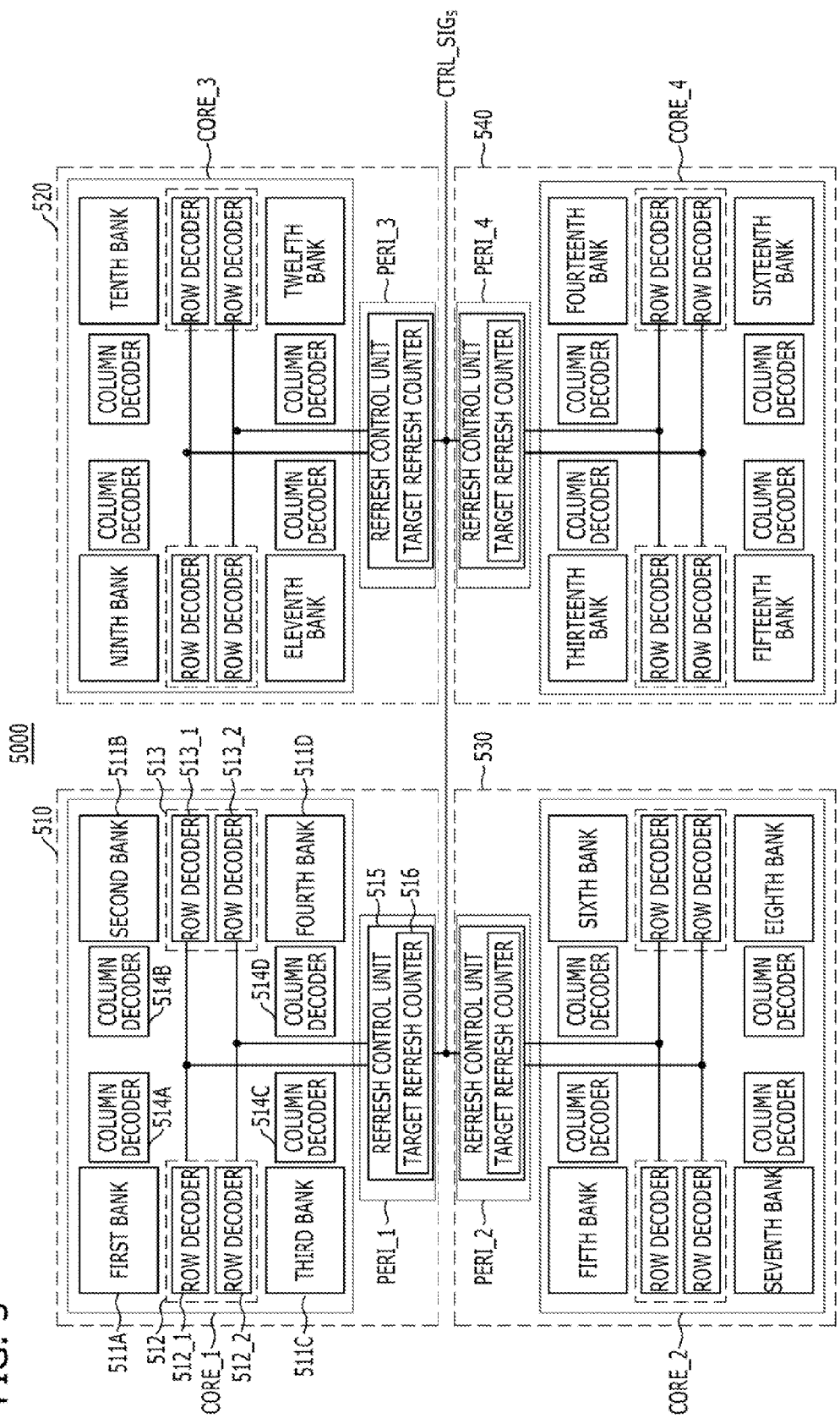
FIG. 5 is a block diagram illustrating a semiconductor memory device in accordance with a third embodiment of the present invention.

FIG. 5 is a block diagram illustrating a semiconductor memory device in accordance with a third embodiment of the present invention.

Referring to FIG. 5, a semiconductor memory device 5000 in accordance with a third embodiment of the present invention includes a first bank group 510, a second bank group 520, a third bank group 530 and a fourth bank group 540. The first bank group 510 is opposite to the second bank group 520 relative to a first peripheral circuit PERI_1 of the first bank group 510 and a second peripheral circuit PERI_2 of the second bank group 520. The third bank group 530 is opposite to the fourth bank group 540 on a basis of a third peripheral circuit PERI_3 of the third bank group 530 and a fourth peripheral circuit PERI_4 of the fourth bank group 540.

The first bank group 510 includes a first peripheral circuit region PERI_1 and a first core region CORE_1.

The first core region CORE_1 includes a first bank 511A, a second bank 511B a third bank 511C, a fourth bank 511D, a first row control region 512, a second row control region 513 and column decoders 514A, 514B, 514C and 514D.

The second bank 511B is disposed separately from the first bank 511A along a first direction. The third bank 511C is disposed separately from the first bank 511A along a second direction. The fourth bank 511D is disposed separately from the second bank 511 along the second direction and from the third bank 511C along the first direction.

The first row control region 512 is disposed between the first bank 511A and the third bank 511C, and controls a row address decoding operation of the first bank 511A and the third bank 511C. The first row control region 512 includes a first row decoder 512_1 for controlling the row address decoding operation of the first bank 511A and a second row decoder 512_2 for controlling the row address decoding operation of the third bank 511C.

The second row control region 513 is disposed between the second bank. 511B and the fourth bank 511D, and controls a row address decoding operation of the second bank 511B and the fourth bank 511D. The second row control region 513 includes a third row decoder 513_1 for controlling the row address decoding operation of the second bank 511B and a fourth decoder 513_2 for controlling the row address decoding operation of the fourth bank 511.

The column decoders 514A and 514B are disposed along a second direction between the first bank 511A and the second bank 511B, and perform a column decoding operation of the first bank 511A and the second bank 511B. The column decoders 514C and 514D are disposed along a second direction between the third bank 511C and the fourth bank 5110, and perform a column decoding operation of the third bank 511C and the fourth bank 511D.

A first refresh control unit 515 is included in the first peripheral circuit region PERI_1, and controls a refresh operation of the first to fourth banks 511A, 511B, 511C and 511D. The refresh operation may represent the TRR operation. Thus, the first refresh control unit 515 may include a circuit for performing the TRR operation, which sequentially active-precharges the word line corresponding to a target row address and adjacent word lines thereto during a TRR mode. The first refresh control unit 515 may include a target refresh counter 516 for receiving and counting the target row address in response to an active command signal.

Moreover, the semiconductor memory device 5000 may further include a target row refresh main control unit (not shown). The refresh control unit 515 receives a plurality of control signals CTRL_SIGs from the target row refresh main control unit (not shown), and controls the TRR operation of the semiconductor memory device 5000 in response to the plurality of control signals CTRL_SIGs.

In the first bank group 510, the first row control region 512 disposed between the first bank 511A and the third bank 511C is opposite to the second row control region 513 disposed between the second bank 511B and the fourth bank 511D. Thus, an area of a refresh operation circuit for performing the TRR operation may be reduced in the first bank group of the semiconductor memory device in accordance with the second embodiment of the present invention.

The second bank group 520 includes a second peripheral circuit region PERI_2 and a second core region CORE_2. Since the configuration of the second bank group 220 is same as the configuration of the first bank group 510, for the convenience of the descriptions, the detailed descriptions of the second bank group 520 will be omitted.

The third bank group 530 includes a third peripheral circuit region PERI_3 and a third core region CORE_3. Since the configuration of the third bank group 530 is same as the configuration of the first bank group 510, for the convenience of the descriptions, the detailed descriptions of the third bank group 530 will be omitted.

The fourth bank group 540 includes a fourth peripheral circuit region PERI_4 and a fourth core region CORE_4. Since the configuration of the fourth bank group 540 is same as the configuration of the first bank group 510, for the convenience of the descriptions the detailed descriptions of the fourth bank group 540 will be omitted.

In the embodiments of the present invention, since a refresh control unit having a target row refresh counter is disposed and shared between row control regions opposite to each other, an area of a refresh circuit for performing the TRR operation may be reduced, and a chip area of the semiconductor memory device may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a plurality of bank groups,
   wherein each of the plurality of bank groups comprises:
   a first bank;
   a second bank disposed separately from the first bank along a first direction;
   a third bank disposed separately from the first bank along a second direction substantially perpendicular to the first direction;
   a fourth bank disposed separately from the second bank along the second direction and from the third bank along the first direction;
   a first row control region, which is disposed between the first bank and the second bank, suitable for controlling a row decoding operation of the first bank and the second bank;
   a second row control region, which is disposed between the third bank and the fourth bank, suitable for controlling a row decoding operation of the third bank and the fourth bank;
   a peripheral circuit region disposed between the first row control region and the second row control region;
   a refresh control unit, which is disposed in the peripheral circuit region, suitable for controlling a refresh operation of the first to fourth banks in response to a plurality of control signals; and
   a target row refresh main control unit suitable for controlling the refresh control unit by providing the plurality of control signals to the refresh control unit.

2. The semiconductor memory device of claim 1, wherein the first row control region includes a first row decoder for performing a row address decoding operation of the first bank, and a second row decoder for performing a row address decoding operation of the second bank, and the second row control region includes a third row decoder for performing a row address decoding operation of the third bank, and a fourth row decoder for performing a row address decoding operation of the fourth bank.

3. The semiconductor memory device of claim 1, wherein the refresh operation includes a target row refresh (TRR) operation that sequentially active-precharges word lines corresponding to a target row address and adjacent word lines thereto.

4. The semiconductor memory device of claim 3, wherein the refresh control unit includes a target row refresh counter for receiving and counting the target row address and generating an address corresponding to the adjacent word lines.

5. The semiconductor memory device of claim 3, wherein the bank group further comprises:
   first and second column decoders, which are disposed along the first direction between the first bank and the third bank, suitable for performing a column decoding operation of the first bank and the third bank; and
   second and fourth column decoders, which are disposed along the first direction between the second bank and the fourth bank, suitable for performing a column decoding operation of the second bank and the fourth bank.

6. A semiconductor memory device, comprising:
   a peripheral circuit region; and
   a plurality of bank group pairs, each bank group within a bank group pair being disposed opposite to each other relative to the peripheral circuit region,
   wherein each of the plurality bank groups comprises:
      a first bank;
      a second bank disposed separately from the first bank along the first direction;
      a third bank disposed separately from the first bank along a second direction substantially perpendicular to the first direction;
      a fourth bank disposed separately from the second bank along the second direction and from the third bank along the first direction;
      a first row control region, which is disposed between the first bank and the third bank, suitable for controlling a row decoding operation of the first bank and the third bank;
      a second row control region, which is disposed between the second bank and the fourth bank, suitable for controlling a row decoding operation of the second bank and the fourth bank;
      a refresh control unit, which is disposed in the peripheral circuit region, suitable for controlling a refresh operation of the first to fourth banks in response to a plurality of control signals; and
      a target row refresh main control unit suitable for controlling the refresh control unit by providing the plurality of control signals to the refresh control unit.

7. The semiconductor memory device of claim 6, wherein the first row control region includes a first row decoder for performing a row address decoding operation of the first bank, and a second row decoder for performing a row address decoding operation of the third bank, and the second row control region includes a third row decoder for performing a row address decoding operation of the second bank, and a fourth row decoder for performing a row address decoding operation of the fourth bank.

8. The semiconductor memory device of claim 6, wherein the refresh operation includes a target row refresh (TRR) operation that sequentially active-precharges word lines corresponding to a target row address and adjacent word lines thereto.

9. The semiconductor memory device of claim 8, wherein the refresh control unit includes a target row refresh counter for receiving and counting the target row address and generating an address corresponding to the adjacent word lines.

10. The semiconductor memory device of claim 6, wherein each of the plurality of bank groups comprises:
    first and second column decoders, which are disposed along the first direction between the first bank and the second bank, suitable for performing a column decoding operation of the first bank and the second bank; and
    second and fourth column decoders, which are disposed along the first direction between the third bank and the fourth bank, suitable for performing a column decoding operation of the third bank and the fourth bank.

11. The semiconductor memory device of claim 6, wherein the target row refresh main control unit is disposed in the peripheral circuit region.

* * * * *